United States Patent
Hidese et al.

(10) Patent No.: US 7,059,043 B2
(45) Date of Patent: Jun. 13, 2006

(54) METHOD FOR MOUNTING AN ELECTRONIC PART BY SOLDER POSITION DETECTION

(75) Inventors: Wataru Hidese, Fukuoka (JP);
Toshiaki Nakashima, Fukuoka (JP);
Hiroshi Haji, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/998,470

(22) Filed: Nov. 29, 2004

(65) Prior Publication Data

US 2005/0108873 A1 May 26, 2005

Related U.S. Application Data

(62) Division of application No. 10/216,126, filed on Aug. 8, 2002, now Pat. No. 6,839,960.

(30) Foreign Application Priority Data

| Aug. 8, 2001 | (JP) | .............................. 2001-240820 |
| Aug. 8, 2001 | (JP) | .............................. 2001-240821 |

(51) Int. Cl.
*H05K 3/30* (2006.01)

(52) U.S. Cl. .............................. 29/832; 29/721; 29/742; 29/746; 29/833; 29/834

(58) Field of Classification Search .................. 29/743, 29/742, 721, 746, 833, 832, 834; 228/9, 228/8, 104

See application file for complete search history.

(56) References Cited

U.S. PATENT DOCUMENTS

| 4,653,664 A | | 3/1987 | Hineno et al. .................. 221/3 |
| 4,772,125 A | * | 9/1988 | Yoshimura et al. ....... 356/237.1 |
| 4,793,707 A | | 12/1988 | Hata et al. .................... 356/615 |
| 4,832,250 A | | 5/1989 | Spigarelli et al. |
| 4,866,837 A | | 9/1989 | Heissenberger et al. |
| 4,951,383 A | | 8/1990 | Amao et al. .................... 29/721 |
| 5,166,753 A | * | 11/1992 | Tokura ........................ 356/394 |
| 5,686,994 A | * | 11/1997 | Tokura ........................ 356/394 |
| 5,740,604 A | | 4/1998 | Kitamura et al. .............. 29/832 |
| 5,839,187 A | * | 11/1998 | Sato et al. ..................... 29/743 |
| 5,880,849 A | | 3/1999 | Van De Ven |
| 5,894,657 A | | 4/1999 | Kanayama et al. ........... 29/740 |
| 6,131,795 A | | 10/2000 | Sato |
| 2002/0046462 A1 | | 4/2002 | Inoue et al. |

FOREIGN PATENT DOCUMENTS

| JP | 2001-185899 | 7/2001 |
| JP | 2002-84097 | 3/2002 |

* cited by examiner

*Primary Examiner*—A. Dexter Tugbang
*Assistant Examiner*—Tai Van Nguyen
(74) *Attorney, Agent, or Firm*—Pearne & Gordon LLP (57) ABSTRACT

An electronic parts mount apparatus for taking out electronic parts from a parts supply section 3 by a transfer head 9 and transporting and mounting the electronic parts to and on a board 2 has a board recognition camera 15 moving independently of the transfer head 9 and advancing to and retreating from the board 2 positioned on a transfer passage 1 for picking up an image of the board 2 to detect the position thereof. The image pickup step of the board 2 by the board recognition camera 15 and the parts taking out step in the parts supply section by the transfer head 9 are performed concurrently. Thus, the tact time can be shortened and the electronic parts can be mounted on the board efficiently.

4 Claims, 12 Drawing Sheets

METHOD FOR MOUNTING AN ELECTRONIC PART BY SOLDER POSITION DETECTION

BACKGROUND OF THE INVENTION

1. Field of the Invention

This invention relates to an electronic parts mount apparatus and an electronic parts mount method for mounting electronic parts on a board.

2. Description of the Related Art

In recent years, the position accuracy for mounting electronic parts on electrodes of a board has been advanced. To mount electronic parts on a board by a transfer head, the board electrodes and the electronic parts need to be registered with high accuracy. Thus, generally images of the board and the electronic parts are picked up by a camera, whereby the board and the electronic parts are recognized and a position shift is detected and then is corrected at the mount operation time before the electronic parts are mounted on the electrodes.

SUMMARY OF THE INVENTION

However, in the described conventional mount apparatus, the image pickup operation of the camera on the board and the mount operation of the transfer head are executed in the same cycle and thus the tact time tends to be delayed. Particularly in a multiple-board board in which a large number of unit boards are built, position detection needs to be conducted for each unit board and thus it takes long time in image pickup and recognition processing, leading to an obstacle to enhancement of the mount efficiency.

It is therefore an object of the invention to provide an electronic parts mount apparatus and an electronic parts mount method capable of efficiently mounting electronic parts on a board.

According to the invention, there is provided an electronic parts mount apparatus for transporting and mounting electronic parts to and on a board by a transfer head having a plurality of suction nozzles for sucking and holding the electronic parts. The electronic parts mount apparatus includes a parts supply section for supplying the electronic parts; a board positioning section for positioning the board; a head move means for moving the transfer head between the parts supply section and the board positioning section, and performing registration operation of the transfer head when the electronic parts are taken out in the parts supply section and when the electronic parts are mounted in the board positioning section; an image pickup means disposed in a manner that the image pickup means can advance to and retreat from the board positioning section, the image pickup means for picking up an image of the board when it advances to above the board in the board positioning section; a position detection means for detecting the position of the board based on image data provided by picking up the image of the board; and a control section for controlling the head move means based on the position detection result.

According to the invention, there is also provided an electronic parts mount apparatus for transporting and mounting electronic parts to and on a board by a transfer head having a plurality of suction nozzles for sucking and holding the electronic parts. The electronic parts mount apparatus includes a parts supply section for supplying the electronic parts; a board positioning section for positioning the board; a head move means for moving the transfer head between the parts supply section and the board positioning section and when the electronic parts are taken out in the parts supply section and when the electronic parts are mounted in the board positioning section, the head move means for performing registration operation of the transfer head; an image pickup means being disposed in a manner that it can advance to and retreat from the board positioning section, the image pickup means for picking up an image of the board when it advances to above the board in the board positioning section; a solder position detection means for detecting the position of solder printed on an electrode of the board based on image data provided by picking up the image of the board; a mount coordinate calculation means for calculating mount coordinates in the mount operation of the electronic parts by the transfer head based on the solder position detection result; and a control section for controlling the head move means based on the mount coordinates.

According to the invention, there is further provided an electronic parts mount method for taking out electronic parts from a parts supply section by a transfer head moved by head move means and transporting and mounting the electronic parts to and on a board positioned in a board positioning section. The electronic parts mount method includes the steps of image picking up for advancing image pickup means disposed in a manner that it can advance to and retreat from the board positioning section to above the board in the board positioning section and picking up an image of the board; position detecting for detecting the position of the board based on image data provided by picking up the image of the board; parts taking out for taking out the electronic parts from the parts supply section by the transfer head; and parts mounting for controlling the head move means based on the position detection result, thereby moving the transfer head to above the board positioned in the board positioning section and mounting the electronic parts on the board. In this method, the step of image picking up is executed by the board positioning section, the step of parts taking out step is executed by the parts supply section, and both of the steps are performed concurrently.

Moreover, according to the invention, there is provided an electronic parts mount method for taking out electronic parts from a parts supply section by a transfer head moved by head move means and transporting and mounting the electronic parts to and on a board positioned in a board positioning section. The electronic parts mount method includes the steps of parts taking out for taking out the electronic parts from the parts supply section by the transfer head; image picking up for advancing image pickup means disposed in a manner that it can advance to and retreat from the board positioning section to above the board in the board positioning section and picking up an image of the board; solder position detecting for detecting the position of solder printed on an electrode of the board based on image data provided by picking up the image of the board; mount coordinate calculating for calculating mount coordinates in the mount operation of the electronic parts by the transfer head based on the solder position detection result; and parts mounting for controlling the head move means based on the mount coordinates and mounting the electronic parts on the board. In this method, the step of image picking up is executed by the board positioning section, the step of parts taking out is executed by the parts supply section, and both steps are performed concurrently.

According to the invention, the board image pickup operation in the board positioning section and the taking out operation of the electronic parts by the transfer head in the parts supply section are performed concurrently, so that the tact time can be shortened and the electronic parts can be mounted on the board efficiently.

In the figures, the reference numeral 101 refers to a transport passage; 102 to a board; 102a to an unit board; 103 to a parts supply section; 109 to a transfer head; 110 to a suction nozzle; 113 to a parts recognition camera 115 to a board recognition camera; 120 to a CPU; 123 to an image recognition section; 126 to a head move mechanism; 127 to a camera move mechanism; 201 to a transport passage; 202 to a board; 202a to an unit board; 203 to a parts supply section; 207 to a transfer head; 208 to a suction nozzle; 210 to parts recognition camera; 212 to a board recognition camera; 220 to a CPU; 223 to an image recognition section; and 224 to a mount coordinate calculation section.

DETAILED DESCRIPTION OF THE PREFERRED EMBODIMENTS

First Embodiment

Figure 1:
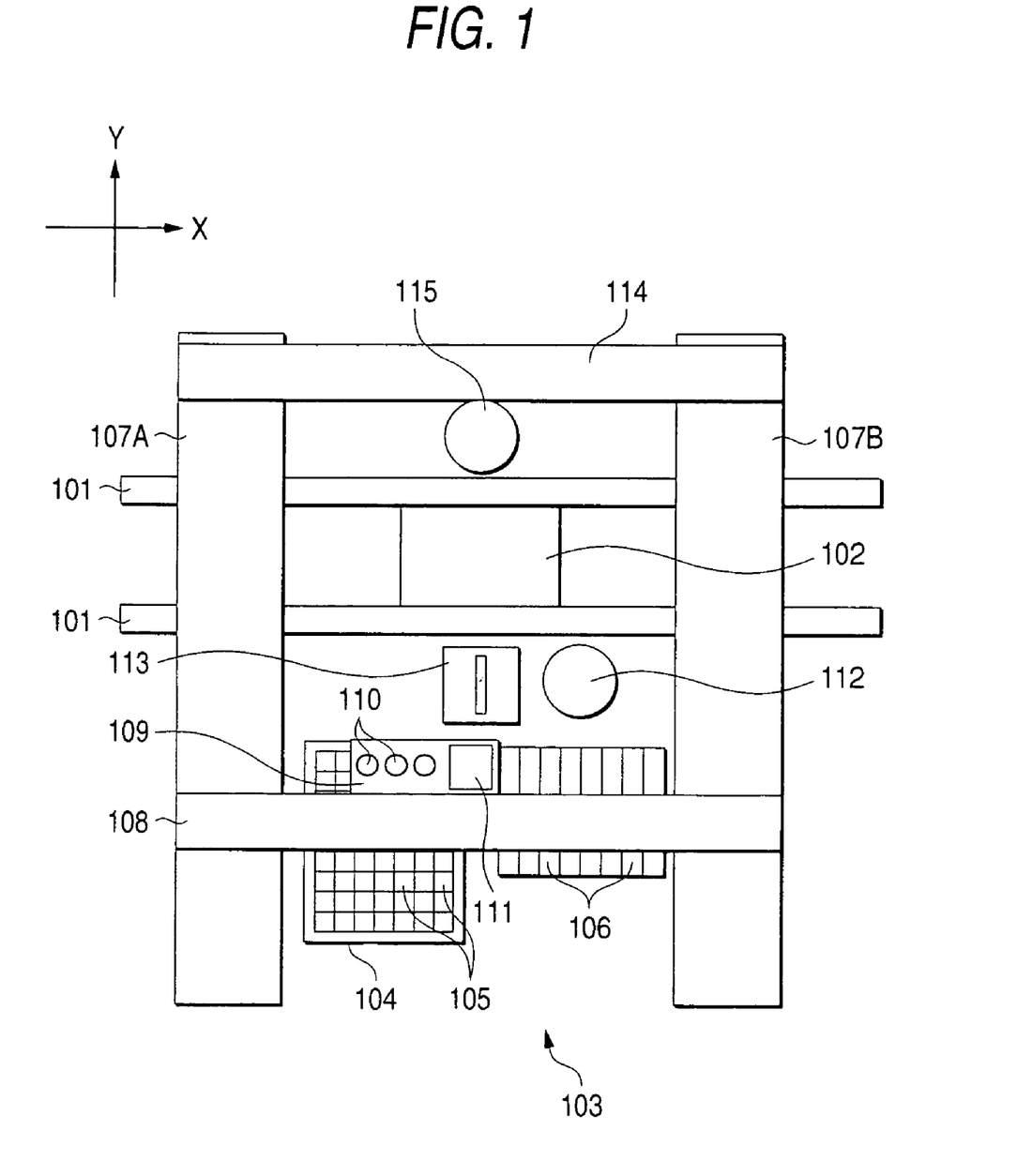
FIG. 1 is a plan view of an electronic parts mount apparatus of a first embodiment of the invention.
Figure 2A:
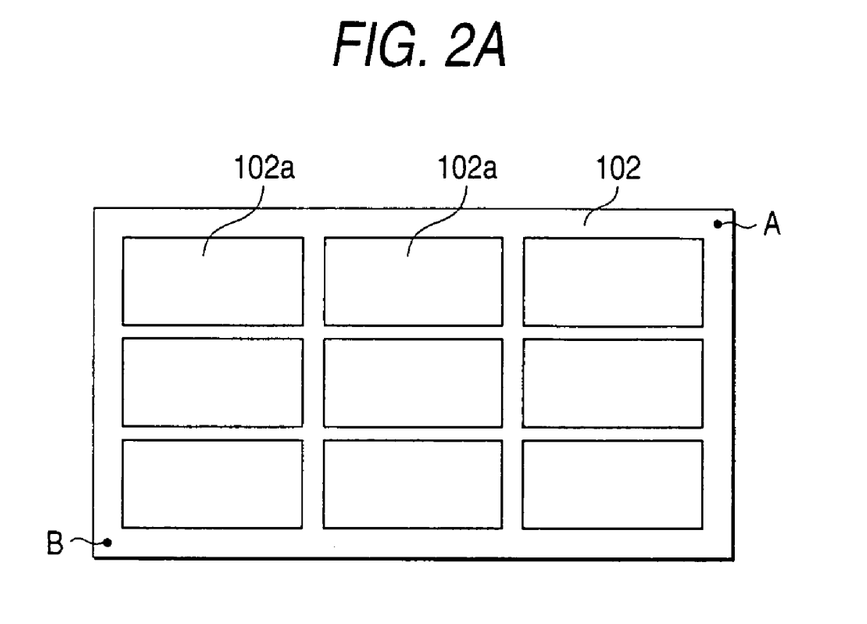
FIG. 2A is a plan view of a board on which parts are to be mounted by the electronic parts mount apparatus of the first embodiment of the invention and FIG. 2B is a plan view of a unit board on which parts are to be mounted by the electronic parts mount apparatus of the first embodiment of the invention.
Figure 2B:
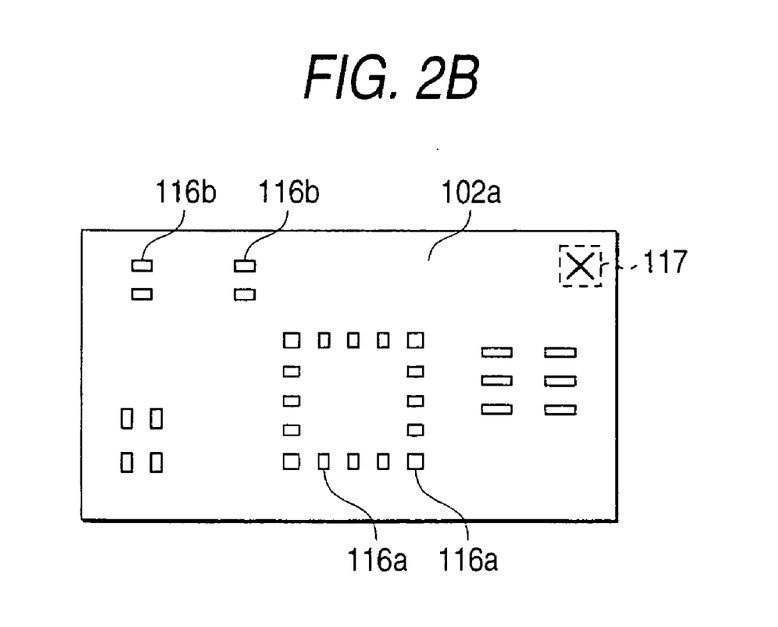
Figure 3:
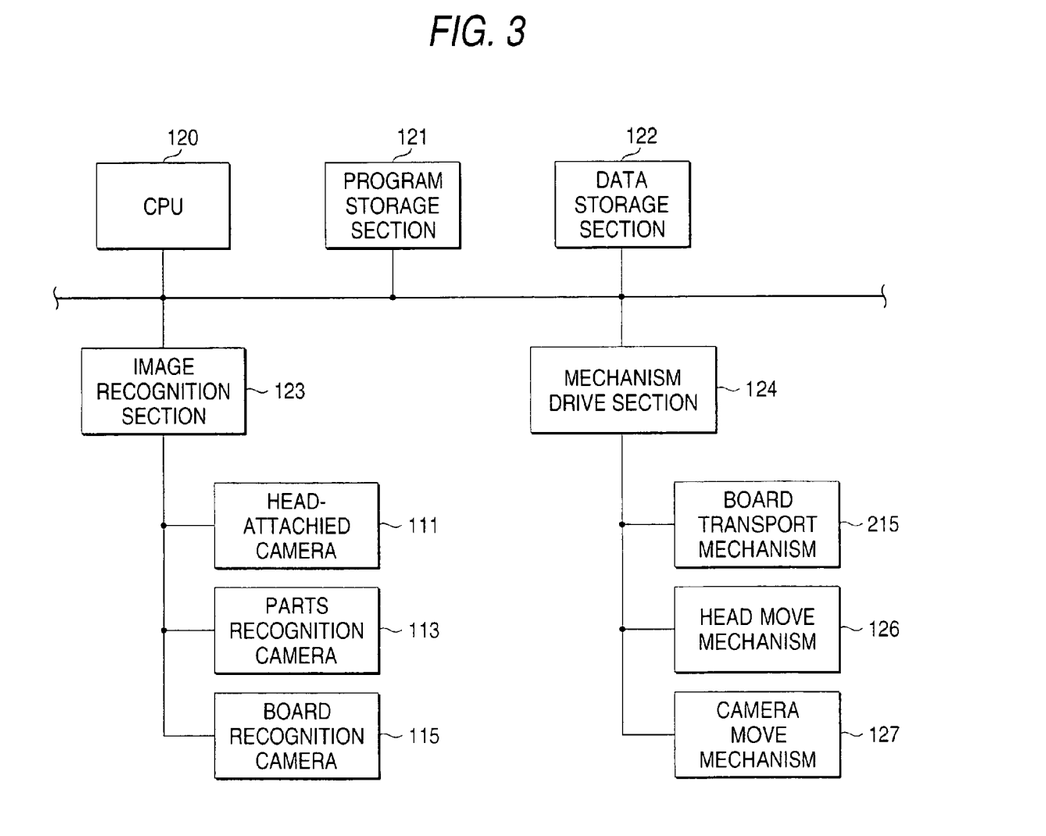
FIG. 3 is a block diagram to show the configuration of a control system of the electronic parts mount apparatus of the first embodiment of the invention.
Figure 4:
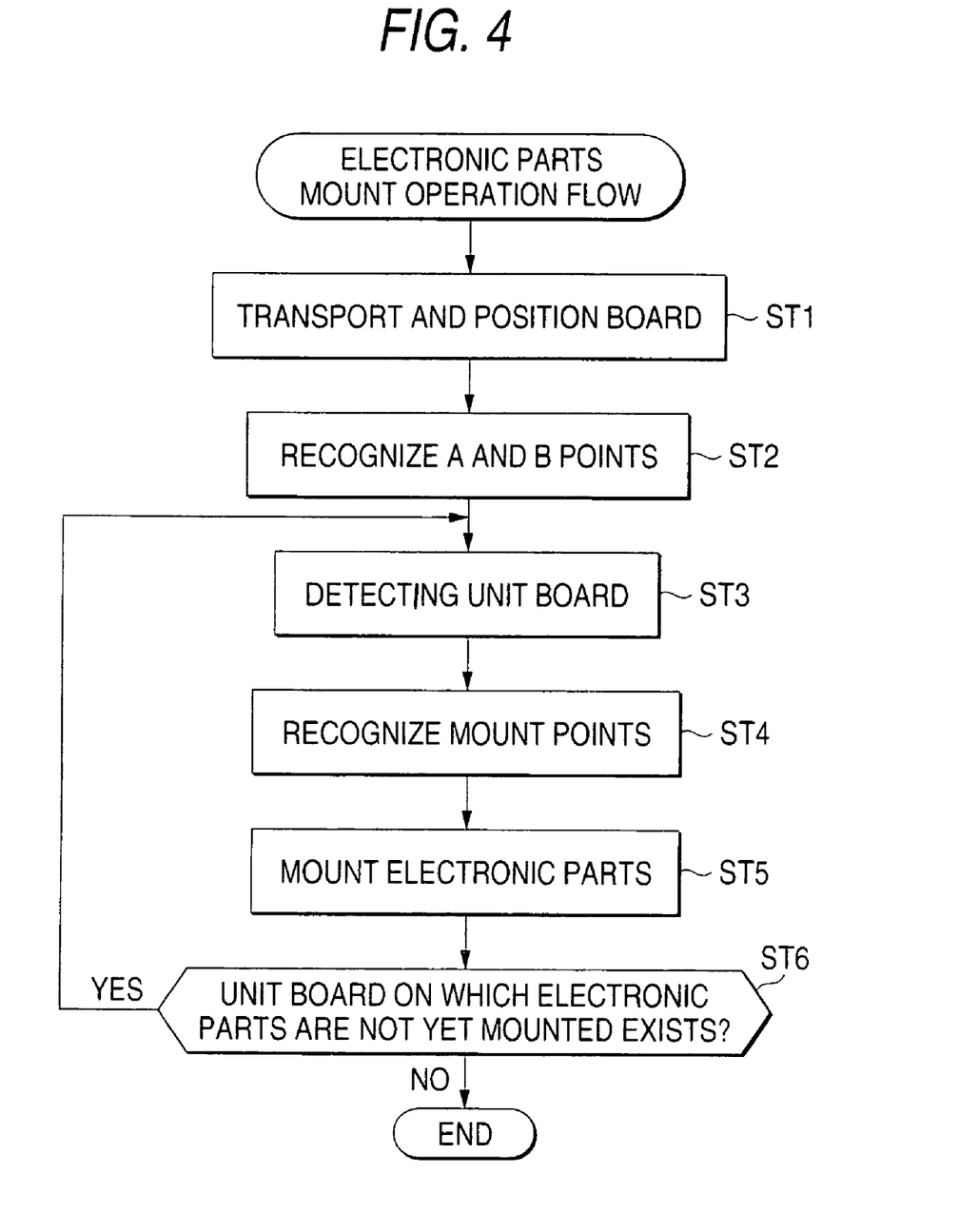
FIG. 4 is a flowchart of the mount operation in an electronic parts mount method of the first embodiment of the invention.

A first embodiment of the invention will be discussed with reference to the accompanying drawings. In the first embodiment, in a technique of mounting semiconductor chips on a board, in a technique of electrically connecting electronic parts to the board via bumps of protrusion electrodes placed on the lower faces of the electronic parts of flip chips, etc., to mount the electronic parts on the board by a transfer head, the board electrodes and the bumps of the electronic parts need to be registered with high accuracy and thus generally images of the board and the bumps of the electronic parts are picked up by a camera, whereby the board and the bumps are recognized and a position shift is detected and then is corrected at the mount operation time before the bumps are mounted on the electrodes. FIG. 1 is a plan view of an electronic parts mount apparatus of the first embodiment of the invention, FIG. 2A is a plan view of a board on which parts are to be mounted by the electronic parts mount apparatus of the first embodiment of the invention, FIG. 2B is a plan view of a unit board on which parts are to be mounted by the electronic parts mount apparatus of the first embodiment of the invention, FIG. 3 is a block diagram to show the configuration of a control system of the electronic parts mount apparatus of the first embodiment of the invention, FIG. 4 is a flowchart of the mount operation in an electronic parts mount method of the first embodiment of the invention, and FIGS. 5A, 5B, 6A, and 6B are process explanation drawings of the electronic parts mount method of the first embodiment of the invention.

To begin with, the whole configuration of the electronic parts mount apparatus will be described with reference to FIG. 1. In FIG. 1, a board 102 on which electronic parts are to be mounted is placed on a transport passage 101 disposed in an X direction. The transport passage 101 receives the board 102 transported from upstream and positions the board 102 at the electronic parts mount position. Therefore, the transport passage 101 serves as the board positioning section for positioning the board.

A parts supply section 103 for supplying electronic parts is disposed before the transport passage 101. The parts supply section 103 is provided with a tray feeder 104 and a tape feeder 106. The tray feeder 104 stores electronic parts 105 with bumps such as flip chips, etc., formed on the lower faces with bumps. The tape feeder 106 stores various chip-type electronic parts (not shown) in a state in which the electronic parts are held on tape.

Above the transport passage 101, two Y-axis tables 107A and 107B are disposed in the Y direction orthogonal to the transport passage 101 with the board positioning section between. A first X-axis table 108 and a second X-axis table 114 are placed on the Y-axis tables 107A and 107B. A transfer head 109 having a plurality of suction is nozzles 110 is attached to the first X-axis table 108 and a board recognition camera 115 is attached to the second X-axis table 114.

As the Y-axis table 107A and the first X-axis table 108 are driven, the transfer head 109 is reciprocated between the parts supply section 103 and the board 102 on the board positioning section (transport passage 101). The electronic parts 105 with bumps are picked up from the tray feeder 104 of the parts supply section 103 and various chip-type electronic parts are picked up from the tape feeder 106. The electronic parts are transported to the board 102 and are registered and then are mounted at mount points on the board 102. Therefore, the Y-axis table 107A and the first X-axis table 108 serve as head move means.

As the Y-axis table 107B and the second X-axis table 114 are driven, the board recognition camera 115 makes a horizontal move in the XY direction and advances to or retreats from the board 102 positioned on the transport passage 101. The board recognition camera 115 advances to an arbitrary position above the board 102 and in this state, picks up an image of the arbitrary position of the board 102 below the camera. A head-attached camera 111 moving integrally with the transfer head 109 is attached to the transfer head 109. The same object is imaged by the head-attached camera 111 and the board recognition camera 115, whereby the coordinate system of the board recognition camera 115 moving independently of the transfer head 109 and the drive coordinate system of the transfer head 109 can be calibrated.

A parts recognition camera 113 and a flux transfer section 112 are placed in the move path of the transfer head 109 between the parts supply section 103 and the transport passage 101. When the transfer head 109 taking out the electronic parts such as flip chips in the parts supply section 103 passes through above the parts recognition camera 113, the parts recognition camera 113 images the electronic parts held on the suction nozzles 110 from below. Accordingly, the electronic parts are recognized and are identified and their positions are detected. After this, the transfer head 109 moves to the flux transfer section 112 and the held electronic parts are moved up and down relative to the application face of the flux transfer section 112, whereby flux for solder joining is applied to the bumps of the electronic parts 105 and joint terminals of the chip-type electronic parts.

Next, the board 102 to mount the electronic parts will be discussed with reference to FIGS. 2A and 2B. As shown in FIG. 2A, the board 102 is a multiple-board board in which a plurality of unit boards 102a are built. Recognition marks A and B for position recognition of the whole board 102 are formed at diagonal positions of the board 102. The recognition marks A and B are imaged by the board recognition camera 115 and the positions of the marks are recognized, whereby the position of the board 102 is detected.

FIG. 2B shows the unit board 102a. Each unit board 102a are formed with various joint electrodes such as an electrode 116a to which the bump of the electronic part 105 is joined and an electrode 116b to which a chip part is joined. A mark application position 117 of an NG mark (in the figure, X) indicating whether or not the unit board 102a is an unusable defective is set in a corner of the unit board 102a. If some defective condition is detected in the unit board 102a in preprocess inspection, an NG mark is applied to the mark application position 117. In the electronic parts mount apparatus, the unit board 102a with an NG mark detected at the board recognition time is determined an NG board and is excluded from the boards to mount electronic parts.

Next, the configuration of the control system will be discussed with reference to FIG. 3. In FIG. 3, a CPU 120 is a general control section for performing centralized control of sections described below. A program storage section 121 stores various programs such as an operation program for executing the mount operation of the transfer head 109 and a processing program for performing recognition processing of board recognition, parts recognition, etc. A data storage section 122 stores various pieces of data such as mount data.

An image recognition section 123 performs recognition processing of the image data provided by image pickup of the head-attached camera 111, the parts recognition camera 113, and the board recognition camera 115. Accordingly, various types of recognition processing of calibration of the coordinate systems of the board recognition camera 115 and the transfer head 109, position detection of the electronic parts held on the transfer head 109, position detection of the board 102 on the transport passage 101, etc., are performed. Therefore, the image recognition section 123 serves as position detection means for detecting the position of the board 102.

A mechanism drive section 124 drives the following mechanisms under the control of the CPU 120. A board transport mechanism 125 is a transport mechanism of the board 102 in the transport passage 101. A head move mechanism 126 (head move means) moves the transfer head 109 by the Y-axis table 107A and the first X-axis table 108. A camera move mechanism 127 moves the board recognition camera 115 by the Y-axis table 107B and the second X-axis table 114. When the CPU 120 controls the head move means, it registers the transfer head 109 relative to the board 102 based on the position detection result of the image recognition section 123.

Figure 5A:
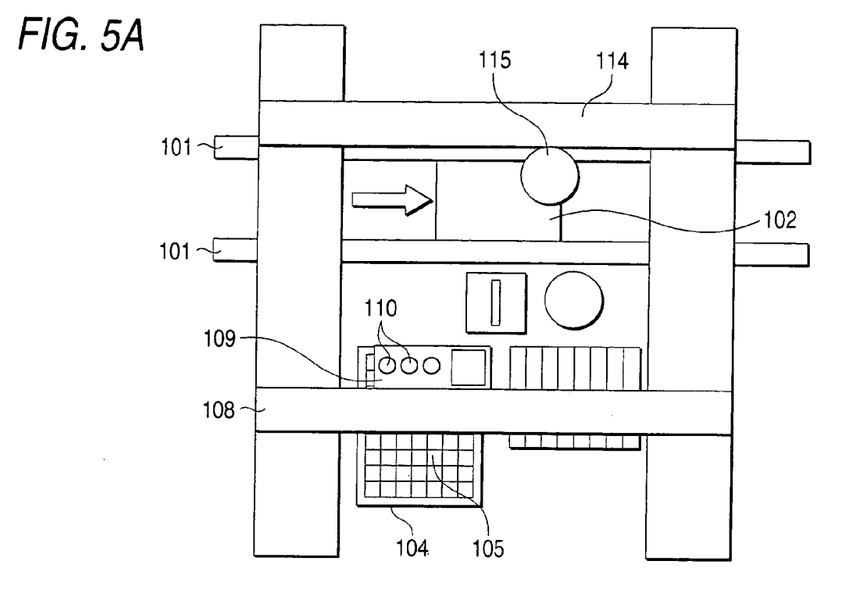
FIGS. 5A and 5B are process explanation drawings of the electronic parts mount method of the first embodiment of the invention.
Figure 5B:
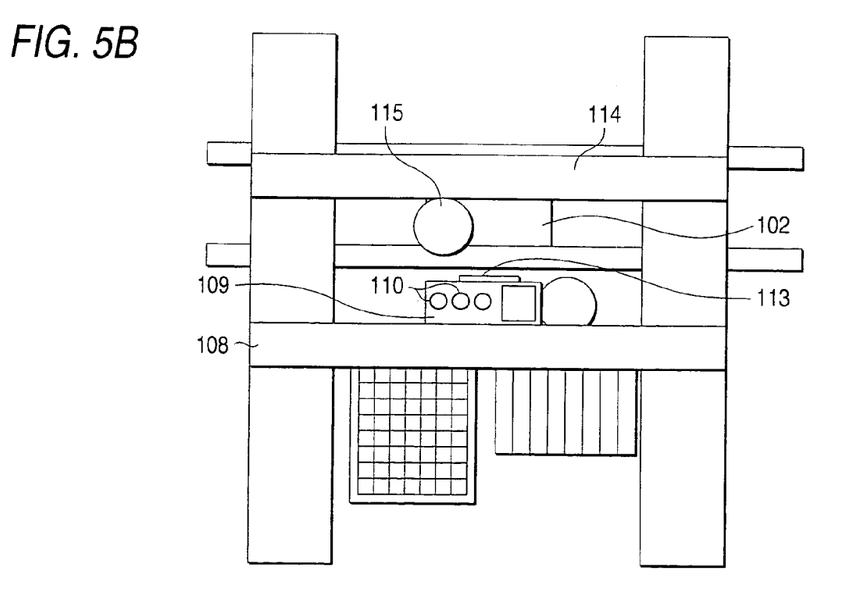

The electronic parts mount apparatus is configured as described above. The electronic parts mount operation will be discussed with reference to FIGS. 5A, 5B, 6A, and 6B according to a flow in FIG. 4. In the flow in FIG. 4, the operation performed on the board 102 in the mount operation is shown. First, the board 102 to mount electronic parts is transported from upstream on the transport passage 101 and is positioned by the board positioning section (ST1). Next, the board recognition camera 115 is moved by the camera move mechanism 127. As shown in FIG. 5A, an image of the recognition mark A of the board 102 is picked up and the position is recognized and next as shown in FIG. 5B, an image of the recognition mark B is picked up and the position is recognized (ST2). Thus, the whole position of the board 102 is detected.

After this, processing is performed for each unit board 102a. That is, an image of each unit board 102a in the board 102 is picked up and first the presence or absence of an NG mark in the mark application position 117 (see FIG. 2A) is recognized for detecting any NG unit board determined to be defective in the preprocess (ST3). The detected NG unit board is excluded from the boards to mount electronic parts and at the following steps, processing is performed only for good unit boards other than the NG unit boards. An image of each unit board 102a determined good is picked up by the board recognition camera 115 and mount points in the unit board 102a are recognized (ST4). Accordingly, the positions of the electrodes 116a and 116b shown in FIG. 2B are recognized.

Figure 6A:
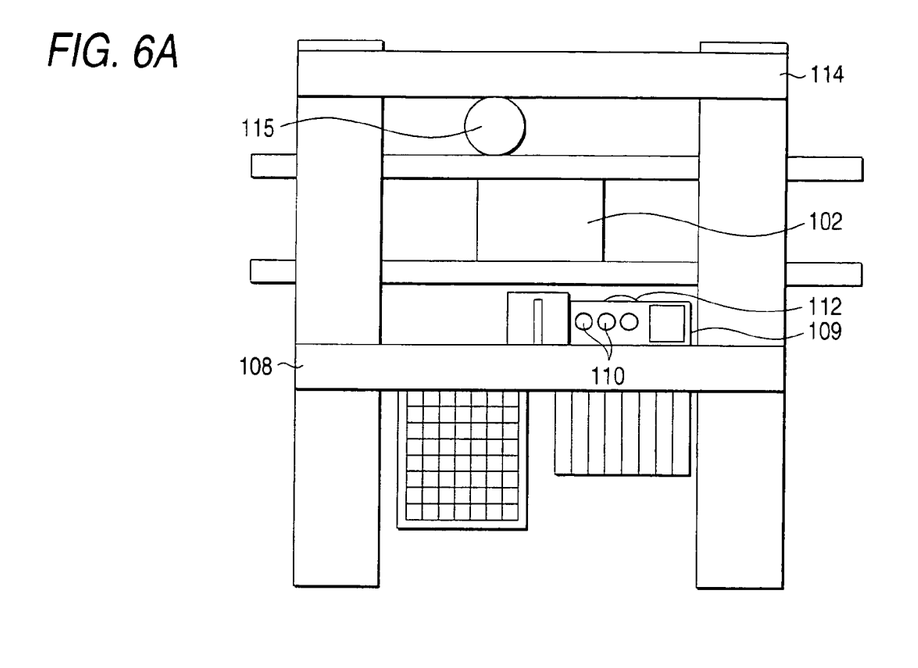
FIGS. 6A and 6B are process explanation drawings of the electronic parts mount method of the first embodiment of the invention.
Figure 6B:
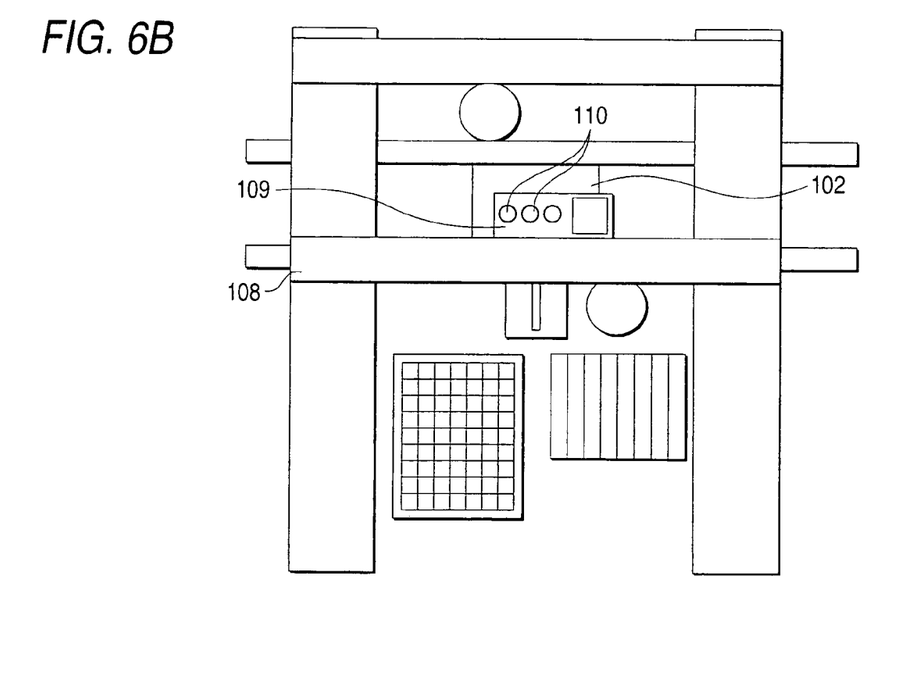

In parallel with the operation at (ST2), (ST3), and (ST4), as shown in FIGS. 5A and 5B, the transfer head 109 takes out the electronic parts 105 from the tray feeder 104 and the chip-type electronic parts from the tape feeder 106 through the suction nozzles 110 and next moves to a point above the parts recognition camera 113. An image of the electronic parts held by the suction nozzles 110 is picked up from below and the electronic parts are identified and their positions are detected. After this, as shown in FIG. 6A, the transfer head 109 moves to a point above the flux transfer section 112 and here, flux is applied to the bumps of the electronic parts 105 and the joint terminals of the chip-type electronic parts.

After this, the electronic parts are mounted (ST5). That is, the transfer head 109 moves to above the board 102 and mounts the held electronic parts at the mount points of the unit board 102a on which the electronic parts are to be mounted. In this mount operation, position shift of the electrode 116a, 116b found by recognizing the mount points at (ST4) and position shift found by recognizing the electronic parts by the parts recognition camera 113 are corrected and high mount position accuracy is provided.

After this, whether or not a unit board 102a on which electronic parts are not yet mounted exists is determined (ST6). If a unit board 102a on which electronic parts are not yet mounted exists, the process returns to (ST3) and for the unit board 102a, NG unit board detection (ST3), mount point recognition (ST4), and mounting the electronic parts (ST5) are executed. If a unit board 102a on which electronic parts are not yet mounted does not exist at (ST6), the mount operation is terminated.

The electronic parts mount method shown in the embodiment described above includes an image pickup step of advancing the board recognition camera 115 disposed in a manner that it can advance to and retreat from the transport passage 101 to a point above the board 102 and picking up an image of the board 102, a position detection step of detecting the positions of the recognition marks A and B of the board 102 and the positions of the mount points of each unit board 102a based on the image data provided by picking up the image, a parts taking out step of taking out the electronic parts from the parts supply section 103 by the transfer head 109, and a parts mount step of moving the transfer head 109 to above the board 102 and mounting the electronic parts on the board 102 based on the position detection result.

When the steps are executed, the image pickup step of the board recognition camera 115 and the parts taking out step of the transfer head 109 are performed concurrently and position detection is executed based on the image pickup result and then immediately a transition can be made to the parts mount step. In the embodiment, an image is picked up for each unit board in the image pickup step and an image of the unit board 102a in the state just before the electronic parts are mounted is picked up, so that even if the electronic parts are mounted on a board easily becoming deformed such as carrier tape, the mount quality excellent in position accuracy can be provided.

The example has been given wherein only position detection of the board 102 is conducted as the board recognition camera 115 picks up an image of the board 102. However, in the process of picking up images of the unit boards in order, an image of each unit board on which the electronic parts have been already mounted is also picked up and the presence or absence of the electronic parts and position shift may be detected based on the image pickup result for performing a mount state inspection. The board recognition camera 115 is thus provided independently of the transfer head 109, so that the board recognition camera 115 can be used for application different in purpose and a more flexible mount method can be provided.

Second Embodiment

Figure 7:
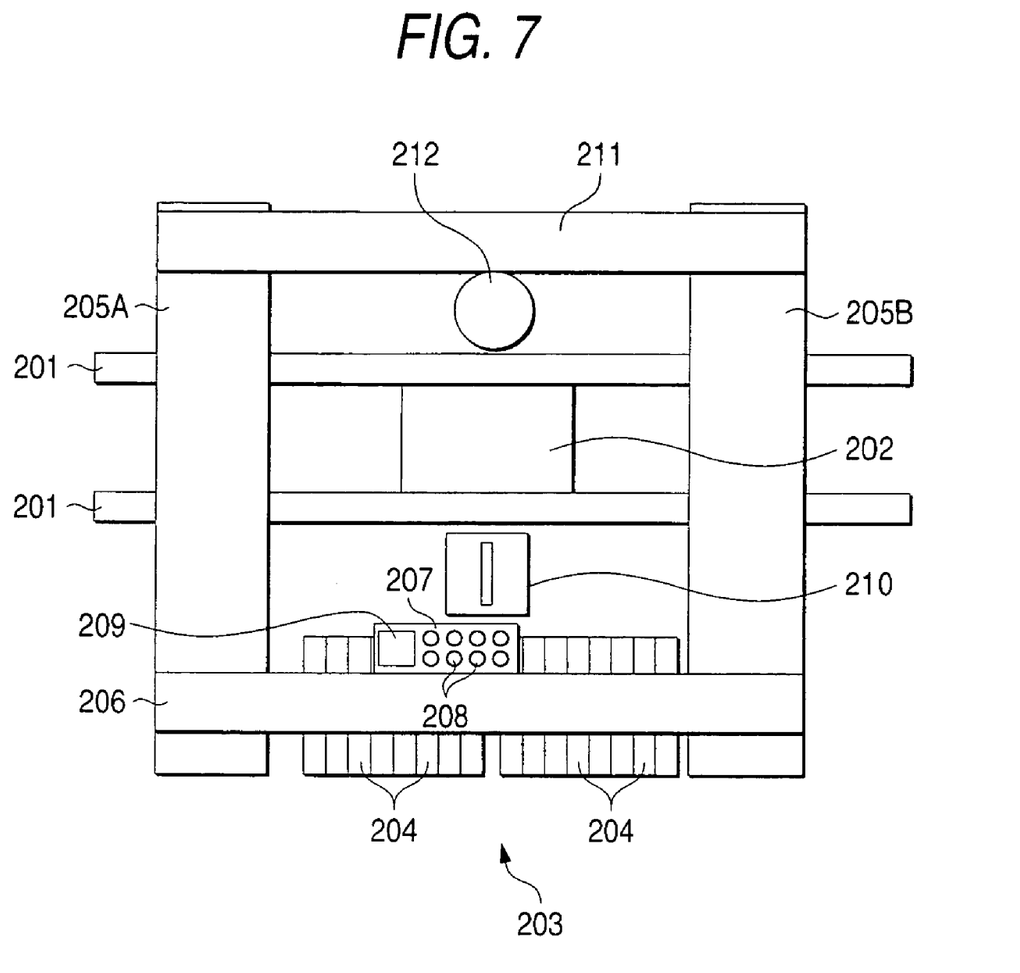
FIG. 7 is a plan view of an electronic parts mount apparatus of a second embodiment of the invention.
Figure 8A:
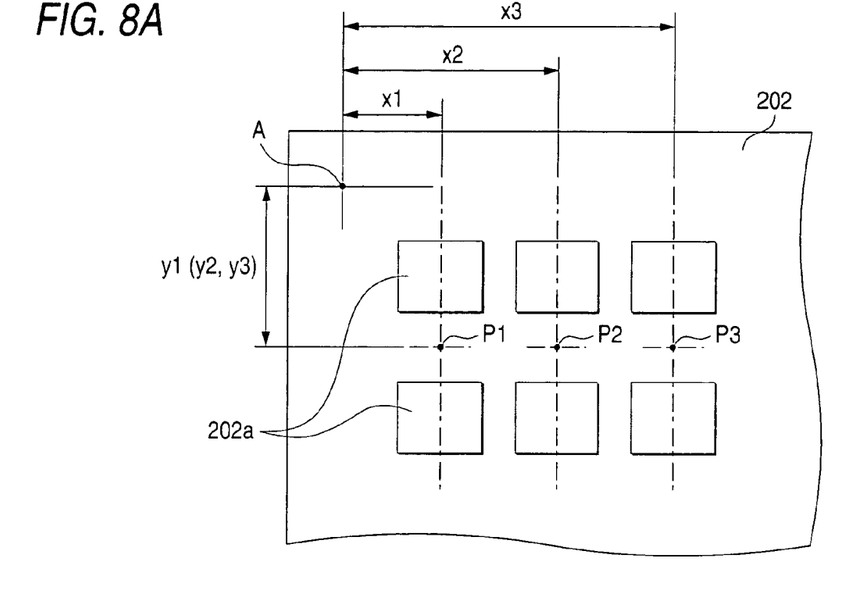
FIGS. 8A and 8B are partial plan views of a board on which parts are to be mounted by the electronic parts mount apparatus of the second embodiment of the invention.
Figure 8B:
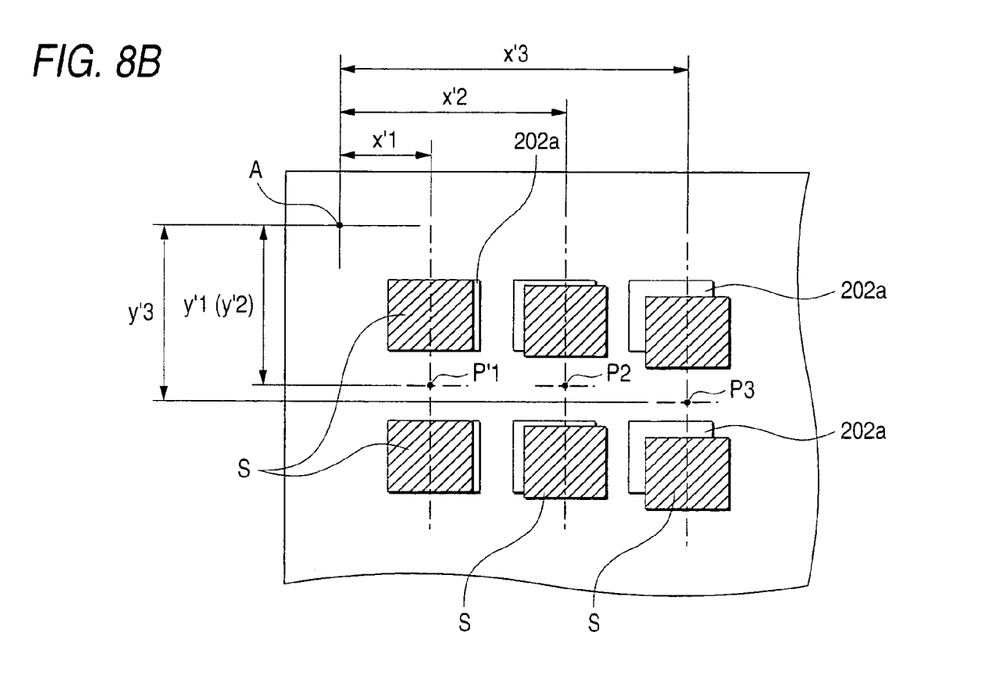
Figure 9:
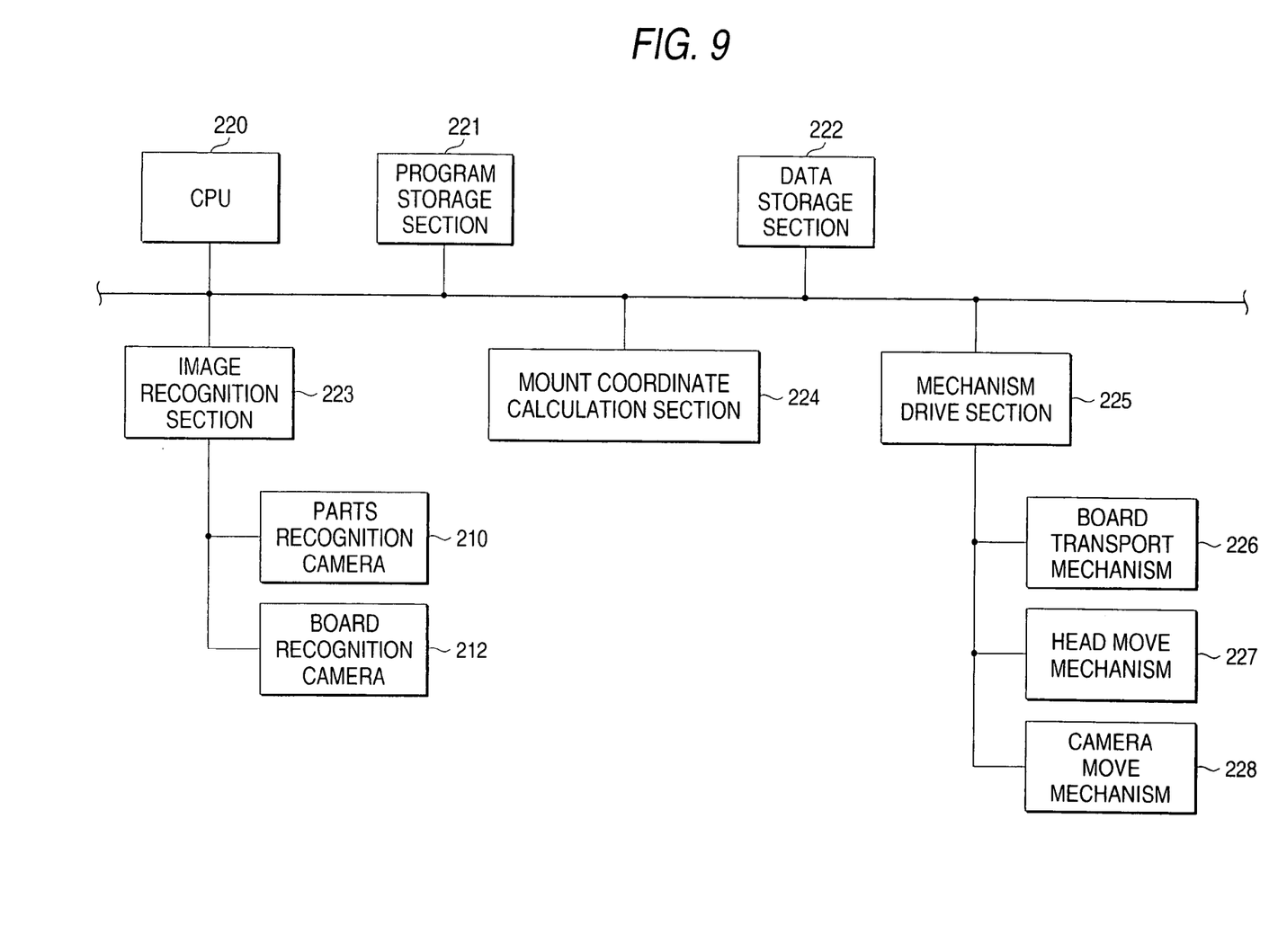
FIG. 9 is a block diagram to show the configuration of a control system of the electronic parts mount apparatus of the second embodiment of the invention.
Figure 10:
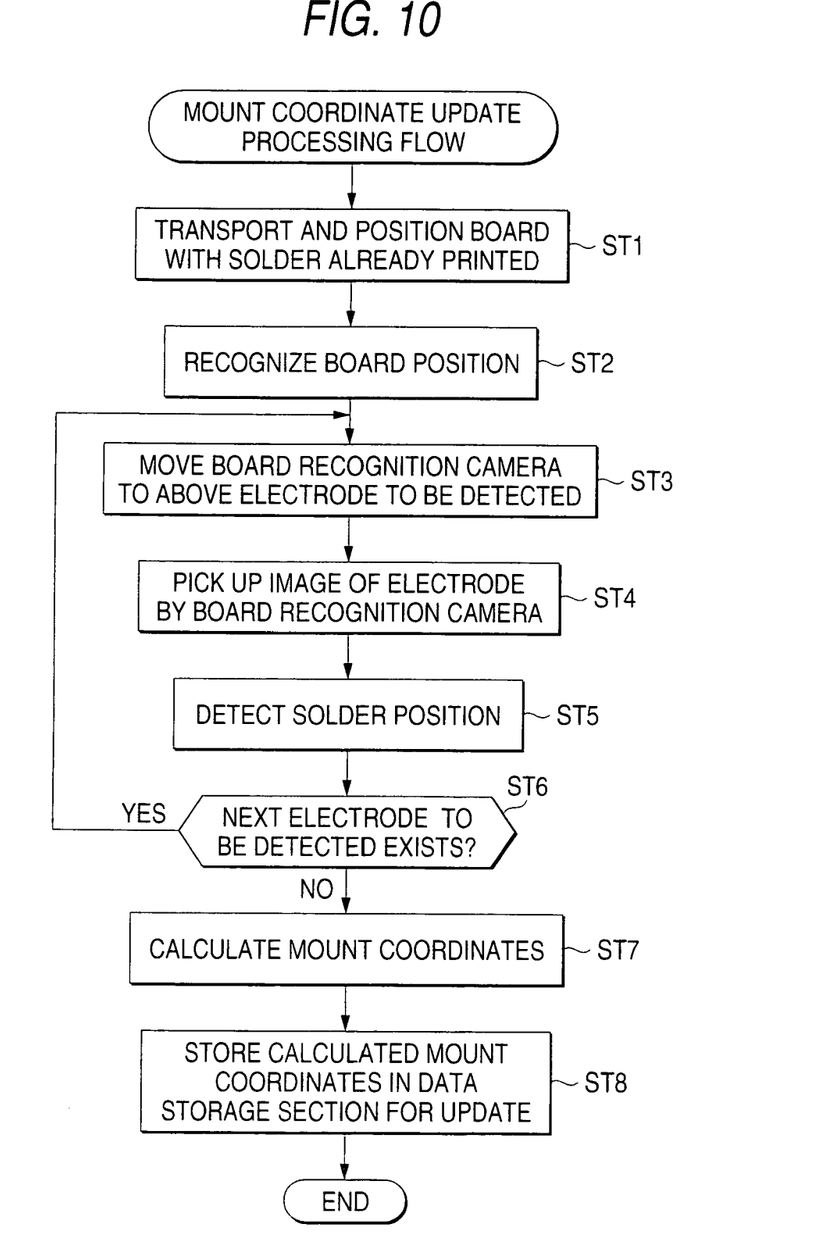
FIG. 10 is a flowchart of mount coordinate update processing of the electronic parts mount apparatus of the second embodiment of the invention.

Next, a second embodiment of the invention will be discussed with reference to the accompanying drawings. The position accuracy to mount electronic parts on board electrodes also becomes advanced with miniaturization of the electronic parts and advance of the packaging density. For example, to mount electronic parts of a minute size of about 0.6 mm×0.3 mm, extremely high mount position accuracy is required. Then, in the second embodiment of the invention, solder after being printed is recognized and position is detected so that electronic parts are correctly registered relative to solder printed on board electrodes, whereby target position coordinates to mount the electronic parts on the board are corrected. FIG. 7 is a plan view of an electronic parts mount apparatus of the second embodiment of the invention, FIGS. 8A and 8B are partial plan views of a board on which parts are to be mounted by the electronic parts mount apparatus of the second embodiment of the invention, FIG. 9 is a block diagram to show the configuration of a control system of the electronic parts mount apparatus of the second embodiment of the invention, FIG. 10 is a flowchart of mount coordinate update processing of the electronic parts mount apparatus of the second embodiment of the invention, and FIGS. 11A, 11B, 12A, and 12B are process explanation drawings of an electronic parts mount method of the second embodiment of the invention.

To begin with, the whole configuration of the electronic parts mount apparatus will be discussed with reference to FIG. 7. In FIG. 7, a board 202 on which electronic parts are to be mounted is placed on a transport passage 201 disposed in an X direction. The transport passage 201 receives the board 202 transported from upstream and positions the board 202 at the electronic parts mount position. Therefore, the transport passage 201 serves as the board positioning section for positioning the board. In a preprocess, cream solder is printed on each electrode of the transported board 202 and an electronic part is mounted on the cream solder.

A parts supply section 203 for supplying electronic parts is disposed before the transport passage 201. The parts supply section 203 comprises a large number of tape feeders 204 placed side by side. The tape feeders 106 store various electronic parts in a state in which the electronic parts are held on tape, and supply the electronic parts to at taking-out position by a transfer head 207 described later.

Above the transport passage 201, two Y-axis tables 205A and 205B are disposed in the Y direction orthogonal to the transport passage 201 with the board positioning section between. A first X-axis table 206 and a second X-axis table 211 are placed on the Y-axis tables 205A and 205B. The transfer head 207 having a plurality of suction nozzles 208 is attached to the first X-axis table 206 and a board recognition camera 212 is attached to the second X-axis table 211.

As the Y-axis table 205A and the first X-axis table 211 are driven, the transfer head 207 is reciprocated between the parts supply section 203 and the board 202 on the board positioning section (transport passage 201). The electronic parts are picked up from the tape feeder 204 of the parts supply section 203 and are transported to and mounted on the board 202. Therefore, the Y-axis table 205A and the first X-axis table 206 serve as transfer head move means.

As the Y-axis table 205B and the second X-axis table 211 are driven, the board recognition camera 212 makes a horizontal move in the XY direction and advances to or retreats from the board 202 positioned on the transport passage 201. The board recognition camera 212 advances to an arbitrary position above the board 202 and in this state, picks up an image of the arbitrary position of the board 202 below the camera. Accordingly, the positions and shapes of the objects to be recognized on the board 202 can be detected. That is, the positions of recognition marks formed on the board 202 and the positions of electrodes 202a to which the electronic parts are joined are detected and an image of cream solder S printed on each electrode 202a is picked up, whereby the position of the cream solder S can be detected, as described later.

A head-attached camera 209 moving integrally with the transfer head 207 is attached to the transfer head 207. The same object is imaged by the head-attached camera 209 and the board recognition camera 212, whereby the coordinate system of the board recognition camera 212 moving independently of the transfer head 207 and the drive coordinate system of the transfer head 207 can be calibrated.

A parts recognition camera 210 is placed in the move path of the transfer head 207 between the parts supply section 203 and the transport passage 201. When the transfer head 207 taking out the electronic parts in the parts supply section 203 passes through above the parts recognition camera 210, the parts recognition camera 210 images the electronic parts held on the suction nozzles 208 from below. Accordingly, the electronic parts are recognized and are identified and their positions are detected.

Next, the board 202 to mount the electronic parts will be discussed with reference to FIGS. 8A and 8B. As shown in FIG. 8A, the board 202 is formed with a large number of the electrodes 202a to which electronic parts connection terminals are solder-joined. A pair of upper and lower electrodes 202a is provided corresponding to two terminals of one chip-type electronic part. That is, P1, P2, and P3 each indicating the midpoint of the electrodes 202a are mount points of the electronic parts and relative position coordinates between a recognition mark A put on the board 202 and the points P1, P2, and P3, (x1, y1), (x2, y2), and (x3, y3), are mount coordinates indicating the positions of the mount points. These mount coordinates are stored in a data storage section 222 as mount data for each board type, as described later.

FIG. 8B shows the board 202 in a state in which cream solder is printed in the preprocess of electronic parts mount. Cream solder S corresponding to the electrode shape is printed on each electrode 202a by a screen printer. The cream solder S does not necessarily match the position of the electrode 202a because of various factors such as a mask plate registration error, etc., in the print process, and a position shift may be shown depending on the electrode 202a.

That is, midpoints P1', P2', and P3' of the cream solder S printed on two paired upper and lower electrodes do not match P1, P2, and P3 shown in FIG. 8A and vary from one electrode to another. In an electronic parts mount method shown in the embodiment, P1', P2', and P3' rather than the target positions P1, P2, and P3 on the essential mount data are adopted as the target positions to mount the electronic parts, so that a glitch at the reflow time caused by the electronic part terminal making a position shift relative to the cream solder S is prevented.

Next, the configuration of the control system of the electronic parts mount apparatus will be discussed with reference to FIG. 9. In FIG. 9, a CPU 220 is a control section for performing calculations required for the operation and processing of the whole electronic parts mount apparatus. A program storage section 221 stores various programs such as an operation program for executing the mount operation of the transfer head 207 and a processing program for performing recognition processing of board recognition, parts recognition, etc. A data storage section 222 stores various pieces of data such as mount data shown in FIG. 8A.

An image recognition section 223 performs recognition processing of the image data provided by image pickup of the head-attached camera 209, the parts recognition camera 210, and the board recognition camera 212. Accordingly, various types of recognition processing of calibration of the coordinate systems of the board recognition camera 212 and the transfer head 207, position detection of the electronic parts held on the transfer head 207, position detection of the cream solder S printed on the board 202, etc., are performed. Therefore, the image recognition section 223 serves as solder position detection means.

A mount coordinate calculation section 224 calculates mount coordinates in the mount operation of the electronic parts by the transfer head 207 based on the solder position detection result of the image recognition section 223. That is, as shown in FIG. 8B, the mount coordinate calculation section 224 calculates relative position coordinates of the solder midpoints P1', P2', and P3' to the recognition mark A, (x'1, y'1), (x'2, y'2), and (x'3, y'3), as new mount coordinates with solder position shift corrected based on the cream solder S positions corresponding to the electrodes 202a.

The calculated mount coordinates are sent to the data storage section 222, whereby the mount coordinates are updated. That is, the mount coordinates determined based on the electrode position coordinates on the design data are initially stored in the data storage section 222 and after the solder positions are detected, the mount coordinates are overwritten with the calculated mount coordinates to update the data.

A mechanism drive section 225 drives the following mechanisms under the control of the CPU 220: A board transport mechanism 226 is a transport mechanism of the board 202 in the transport passage 201. A head move mechanism 227 (head move means) moves the transfer head 207 by the Y-axis table 205A and the first X-axis table 206. When the transfer head 207 performs the parts mount operation on the board 202, the head move mechanism 227 is driven based on the updated mount data. A camera move mechanism 228 moves the board recognition camera 212 by the Y-axis table 205B and the second X-axis table 211. When the CPU 220 controls the head move means, it registers the transfer head 207 relative to the board 202 based on the updated mount coordinates.

The electronic parts mount apparatus is configured as described above. The mount method of the electronic parts mount apparatus will be discussed. Here, to mount the electronic parts on the board 202 with cream solder printed in the preprocess, the cream solder print position is previously detected for each electrode and the mount coordinates are updated based on the solder position detection result. This mount coordinate update, processing will be discussed with reference to FIG. 10.

First, in FIG. 10, the board 202 with solder already printed is transported on the transport passage 201 and is positioned by the board positioning section (ST1). Next, the board recognition camera 212 is advanced to above the board 202, an image of the recognition mark A of the board 202 (see FIG. 8) is picked up by the board recognition camera 212, and the position of the board 202 is recognized (ST2). Next, the camera move mechanism 228 is driven for positioning the board recognition camera 212 above the electrode 202a whose position is to be detected (ST3) and an image of the electrode 202a is picked up by the board recognition camera 212 for obtaining image data (ST4). To move the board recognition camera 212 when imaging each electrode 202a, the mount position data prepared based on the design data and stored in the data storage section 222 is used.

Next, as shown in FIG. 8B, cream solder S printed on the electrode 202a is recognized by the image recognition section 223 based on the obtained image data and the solder position is detected (ST5). After this, whether or not the next electrode 202a to be detected exists is determined (ST6). If the next electrode 202a to be detected exists, control returns to ST3 and solder position detection is repeated. If it is determined at ST6 that all electrodes have been detected, the mount coordinate calculation section 224 calculates the relative coordinates of the print points P1', P2', P3'. . . (barycentric position of cream solder printed on a pair of electrodes 202a) to the recognition mark A, (x'1, y'1), (x'2, y'2), (x'3, y'3) . . . , as mount coordinates based on the solder position detection result, and stores the coordinates in the data storage section 222 (ST8). The mount position data preparation processing with solder position shift considered is now complete.

Figure 11A:
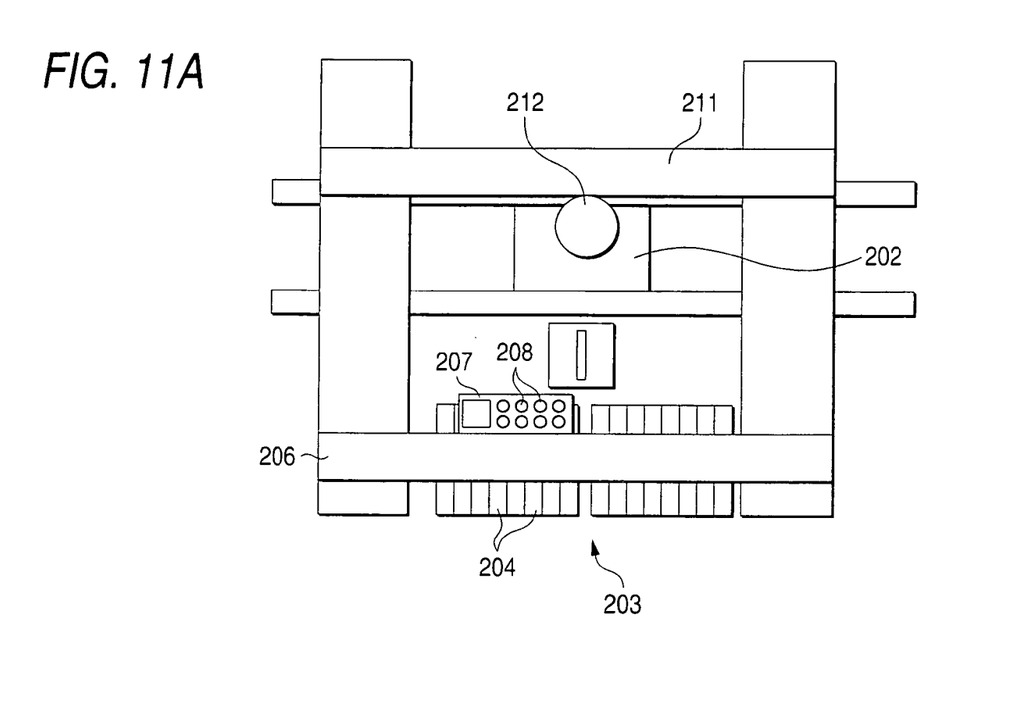
FIGS. 11A and 11B are process explanation drawings of an electronic parts mount method of the second embodiment of the invention.
Figure 11B:
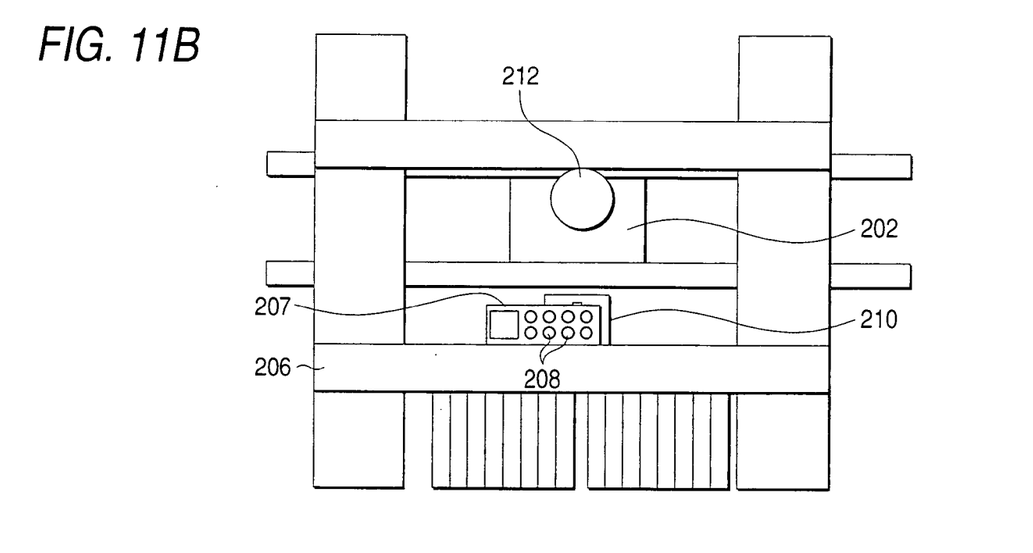

In parallel with the operation at (ST1) to (ST8), the transfer head 207 takes out the electronic parts from the tape feeder of the parts supply section 203 through the suction nozzles 208 as shown in FIG. 11A, and next moves to a point above the parts recognition camera 210 as shown in FIG. 11B. The transfer head 207 makes a horizontal move at predetermined scan speed over the parts recognition camera 210, whereby the electronic parts held by the suction nozzles 208 are imaged in order from below.

Figure 12A:
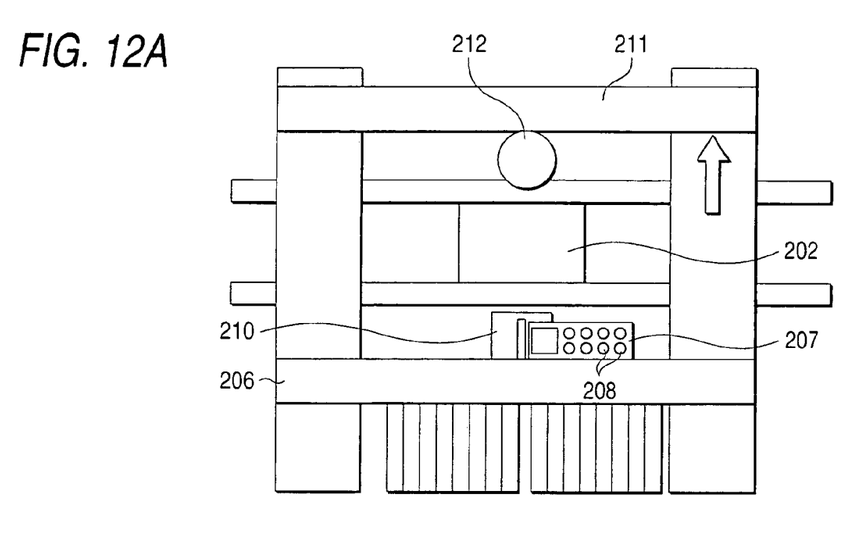
FIGS. 12A and 12B are process explanation drawings of the electronic parts mount method of the second embodiment of the invention.

FIG. 12A shows the state in which the image pickup is complete in such a manner. The image recognition section 223 performs recognition processing of the image provided by the image pickup, thereby identifying the electronic parts and detecting their positions. In this state, the board recognition camera 212 retreats from above the board 202 and does not hinder advancing of the transfer head 207 to above the board 202.

Figure 12B:
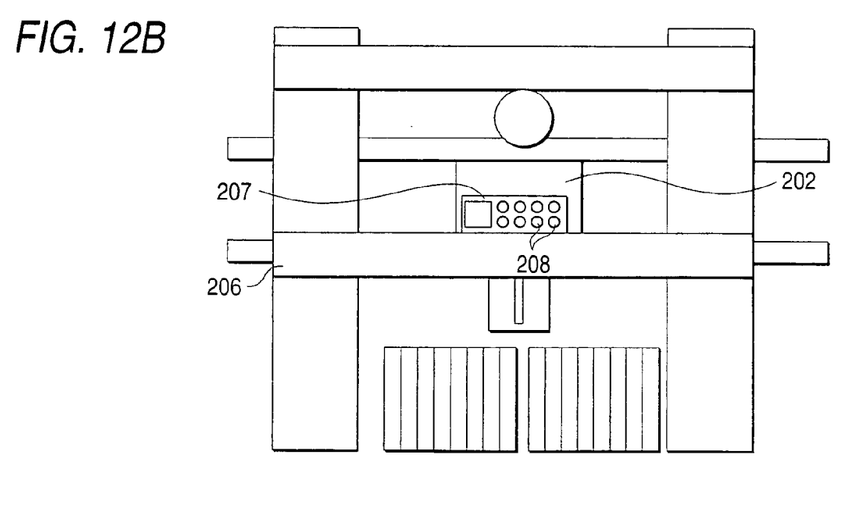

After this, as shown in FIG. 12B, the transfer head 207 moves to above the board 202 and mounts the held electronic part at the mount point of the board 202. In this mount operation, the electronic parts are mounted on the electrodes 202a in accordance with the mount coordinates updated based on the solder detection result described above. That is, if the printed solder S makes a position shift relative to the electrode 202a as shown in FIG. 8(b), the electronic parts are mounted at the cream solder S print points P'1, P'2, P'3 . . . as the target positions rather than the positions of the electrodes 202a. Therefore, the terminals of the electronic parts are mounted without any position shift relative to the cream solder S although they are in a position shift state relative to the electrodes 202a.

After this, the board 202 with the electronic parts mounted at the electrode positions is sent to a reflow process and is heated, whereby the cream solder S is melted and the terminals of the electronic parts are solder-joined to the electrodes 202a. At this time, the terminal placed in the position shift state relative to the electrode 202a before heating is drawn near the electrode 202a by the self-alignment effect when the cream solder S is melted, namely, the effect of spreading the melted solder along the surface of the electrode 202a, and is solder-joined to the electrode 202a at the correct position and attitude relative to the electrode 202a without a position shift.

As described above, in the embodiment, the mount position data is prepared based on the solder print position measurement result on the real substrate. Thus, mount position shift of each electronic part caused by variations in solder print positions on the board can be prevented and if the electronic parts of a minute size requiring high mount accuracy are to be mounted, it is made possible to prevent position shift of the electronic parts after being solder-joined and decrease mount defectiveness.

The electronic parts mount method shown in the embodiment described above includes an image pickup step of advancing the board recognition camera 212 disposed in a manner that it can advance to and retreat from the transport passage 201 to a point above the board 202 and picking up an image of the board 202, a solder position detection step of detecting the positions of solder printed on the electrodes 202 of the board 202 based on the image data provided by picking up the image, a mount coordinate calculation step of calculating the mount coordinates in the mount operation of the electronic parts by the transfer head 207 based on the solder position detection result, and a parts mount step of performing registration by the head move means based on the mount coordinates and mounting the electronic parts on the board 202.

When the steps are executed, the image pickup step of the board recognition camera 212 for detecting the solder positions and the parts taking out step of the transfer head 207 are performed concurrently and the mount coordinates are calculated based on the solder position detection result and then immediately a transition can be made to the parts mount step. Thus, the tact time can be shortened and the electronic parts can be mounted efficiently as compared with the method in the related art performing the image pickup step and the parts taking out step in the same cycle.

According to the invention, the board image pickup operation in the board positioning section and the taking out operation of the electronic parts by the transfer head in the parts supply section are performed concurrently, so that the tact time can be shortened and the electronic parts can be mounted on the board efficiently.

What is claimed is:

1. An electronic parts mount method for taking out electronic parts from a parts supply section by a transfer head moved by head move means and transporting and mounting the electronic parts to and on a board positioned in a board positioning section, the electronic parts mount method comprising the steps of:

parts taking out for taking out the electronic parts from the parts supply section by the transfer head;

image picking up for advancing image pickup means disposed in a manner that the image pickup means can advance to and retreat from the board positioning section to above the board in the board positioning section, and picking up an image of the board;

solder position detecting for detecting the position of solder printed on an electrode of the board based on image data provided by picking up the image of the board;

mount coordinate calculating for calculating mount coordinates in the mount operation of the electronic parts by the transfer head based on the solder position detection result; and parts mounting for controlling the head move means based on the mount coordinates for mounting the electronic parts on the board;

wherein the step of image picking up is executed by the board positioning section, the step of parts taking out is executed by the parts supply section, and both of the steps are performed concurrently.

2. The electronic parts mount method according to claim 1, wherein the mount coordinates calculated by the mount coordinate calculation means are stored in a data storage section.

3. An electronic parts mounting method for removing electronic parts from a parts supply section by a transfer head, the transfer head being moved by a head moving structure, for transporting the electronic parts to a board positioned in a board positioning section, and for mounting the electronic parts on the board, the electronic parts mounting method comprising the steps of:

removing the electronic parts from the parts supply section by the transfer head, which is provided in the parts supply section;

capturing an image of the board positioned in the board positioning section, wherein the step of capturing is performed by an image pickup device disposed on the board positioning section in a manner that the image pickup device can advance to and retreat from an area above the board;

detecting a position of solder printed on an electrode of the board based on image data provided by capturing the image of the board;

calculating mount coordinates for the mounting of the electronic parts by the transfer head, the calculation being based on detecting the position of the solder;

controlling the head moving structure based on the mount coordinates; and mounting the electronic parts on the board, wherein the steps of capturing and removing are performed concurrently.

4. The electronic parts mounting method according to claim 3 further comprising the step of storing the mount coordinates in a data storage section.

* * * * *